Figure 1:
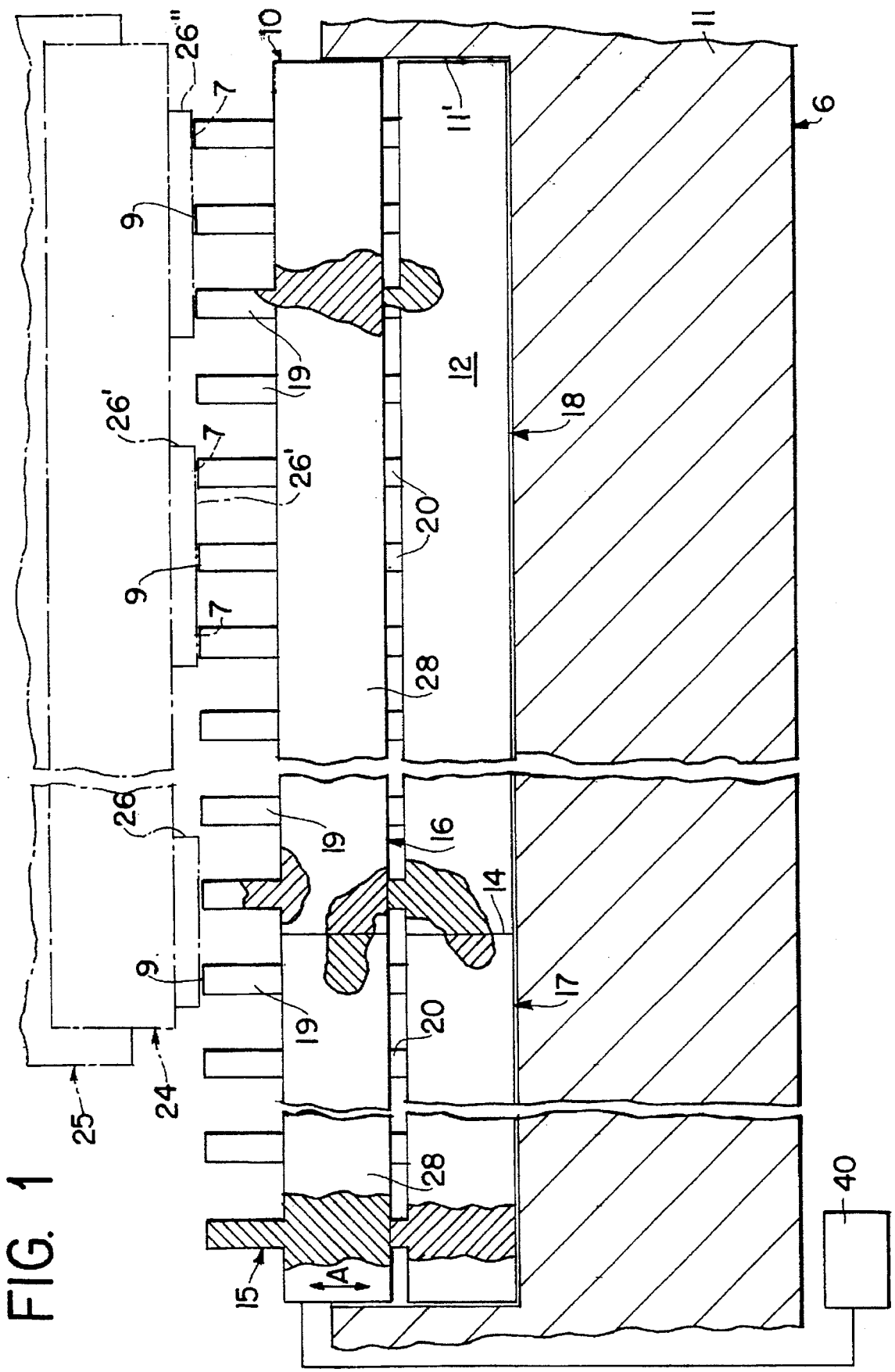

United States Patent

Arnaudov et al.

[11] Patent Number: 5,625,297
[45] Date of Patent: Apr. 29, 1997

[54] TESTING DEVICE FOR TESTING ELECTRICAL OR ELECTRONIC TEST SPECIMENS

[75] Inventors: Konstantin Arnaudov, Wertheim-Bettingen; Manfred Prokopp, Wertheim, both of Germany

[73] Assignee: atg electronic GmbH, Wertheim-Reicholzheim, Germany

[21] Appl. No.: 772,356

[22] PCT Filed: Apr. 25, 1990

[86] PCT No.: PCT/EP90/00668

§ 371 Date: Dec. 26, 1991

§ 102(e) Date: Dec. 26, 1991

[87] PCT Pub. No.: WO90/13039

PCT Pub. Date: Nov. 1, 1990

[30] Foreign Application Priority Data

Apr. 26, 1989 [DE] Germany ................ 39 13 796.1

[51] Int. Cl.$^6$ .................................................. G01R 31/26
[52] U.S. Cl. ................................................ 324/754; 324/755
[58] Field of Search ........................... 324/72.5, 158 P, 324/158 F, 754, 756, 755; 439/482; 29/852; 156/647

[56] References Cited

U.S. PATENT DOCUMENTS

| | | | |
|---|---|---|---|
| 4,038,599 | 7/1977 | Bove | 324/158 F |
| 4,175,253 | 11/1979 | Pitegoff | 324/754 |
| 4,423,373 | 12/1983 | Lecroy, Jr. | 324/754 |
| 4,443,756 | 4/1984 | Lightbody | 324/73 PC |
| 4,528,500 | 7/1985 | Lightbody | 324/73 PC |
| 4,566,184 | 1/1986 | Higgins | 29/840 |
| 4,585,991 | 4/1986 | Reid | 324/158 P |
| 4,672,314 | 6/1987 | Kokkas | 324/158 R |
| 4,924,589 | 5/1990 | Leedy | 29/832 |
| 4,994,736 | 2/1991 | Davis et al. | 324/158 R |
| 5,172,050 | 12/1992 | Swapp | 324/72.5 |
| 5,177,439 | 1/1993 | Liu et al. | 324/72.5 |

FOREIGN PATENT DOCUMENTS

| | | |
|---|---|---|
| 0130350 | 1/1985 | European Pat. Off. |
| 53-37077 | 4/1978 | Japan ................ 324/754 |

OTHER PUBLICATIONS

E.J. Dombroski and W.C. McNaney, "Floating Bias Plate for Duckling Column Contactor", IBM Technical Disclosure Bulletin, vol. 18, No. 4 (Sep. 1975), pp. 1038–1039.

N. A. Bojarczuk and J. R. Lloyd, "Ultra–Small Test Probe", IBM Technical Disclosure Bulletin, vol. 26, No. 3A (Aug. 1983), pp. 1100–1101.

Primary Examiner—Vinh P. Nguyen
Attorney, Agent, or Firm—Darby & Darby

[57] ABSTRACT

A testing device for a printed circuit includes a plate which is at least partly constituted by semiconducting material, and sensing elements for the transmission of testing signals between the testing device and the printed circuit. The sensing elements may be in the form of projections or coils integral with the plate or in the form of pins receivable in recesses of the plate. The printed circuit has pads for the transfer of testing signals between the circuit and the testing device, and the sensing elements are so densely packed that at least two sensing elements cooperate with each pad.

10 Claims, 8 Drawing Sheets

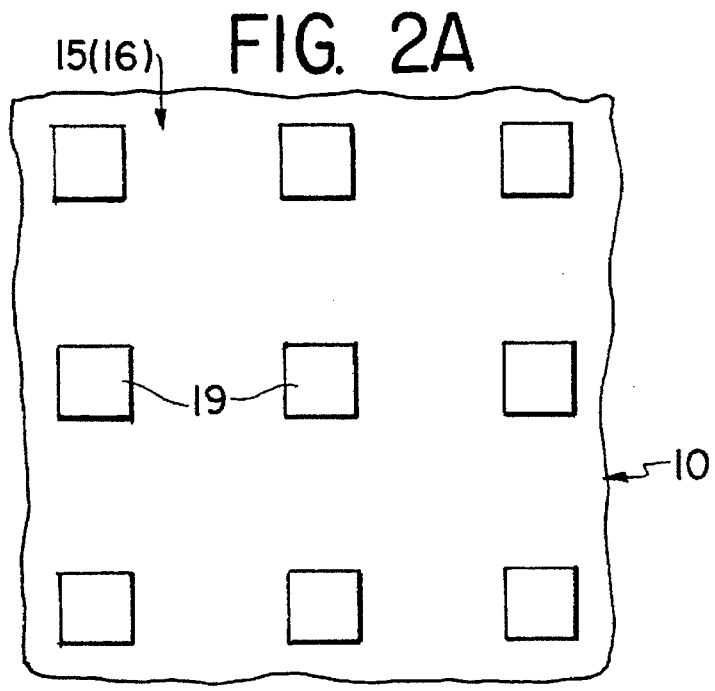
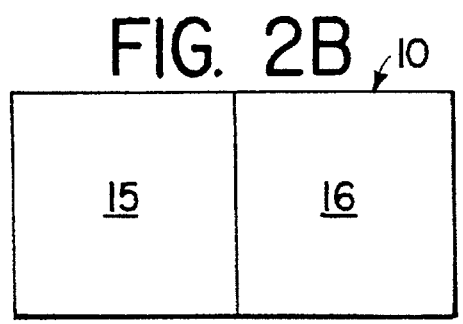 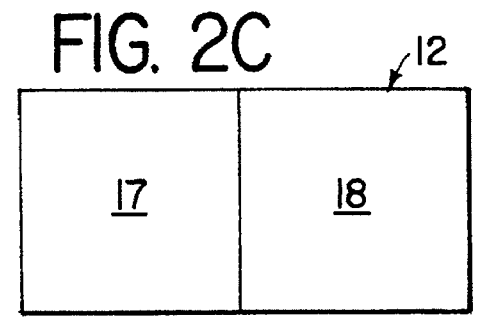
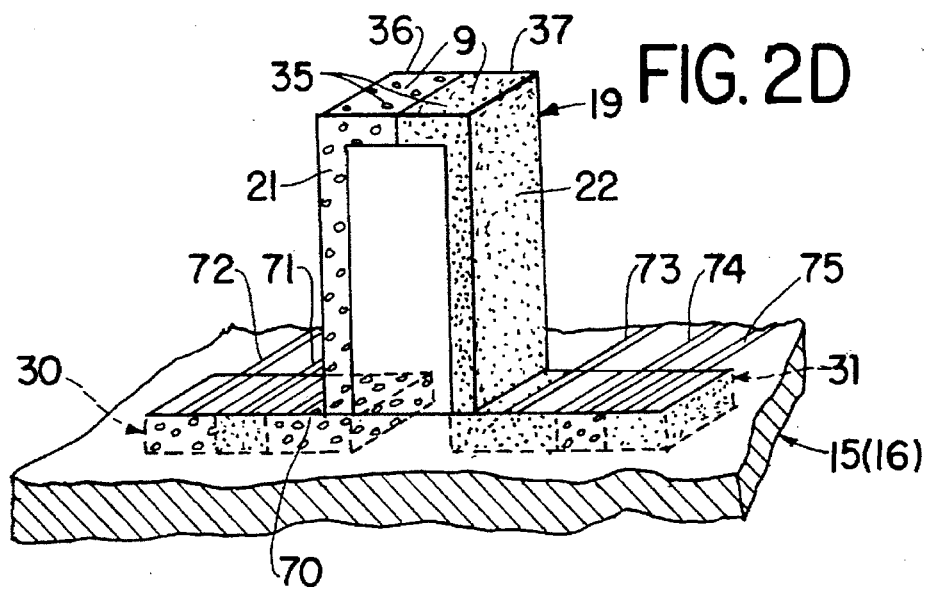

TESTING DEVICE FOR TESTING ELECTRICAL OR ELECTRONIC TEST SPECIMENS

The invention relates to a testing device for checking electrical or electronic test specimens, particularly printed circuit boards, chips and multichip systems. The device has sensing points which, to check the functioning of the test specimen, can be arranged opposite test points of the test specimen for the transfer of testing signals.

A sensing point of the testing device is understood as a location which, when a test point of a test specimen is disposed opposite the same during testing of the test specimen, is adapted to connect this test point with the testing circuit system of the testing device for the transmission of test signals. An individual sensing point can be constituted by a single surface or by a plurality of surfaces. This surface, or these surfaces, are preferably point-like but can have other designs, e.g., linear, circular, and so on.

A test point of the test specimen is a location, or a plurality of locations, of the test specimen to which test signals from the testing circuit system of the testing device can be conducted via an oppositely disposed sensing point of this testing device, or from which test signals can be transferred to the testing circuit system via the respective sensing point of the testing device. By way of example, a test point of the test specimen can be at least one location of a conductive path, a pad, a metallic connection, an electrical or electronic component of the test specimen, a socket or the like.

A test signal can, for instance, be an electrical current, an electrical voltage or the like which is conducted to an associated test point of the respective test specimen via a sensing point of the testing device or which, for the purpose of conduction to the testing circuit system of the testing device, is conducted away from a test point of the test specimen by means of a sensing point of the testing device. The testing circuit system of the testing device then determines, for example, those test points of the respective test specimen between which a test signal is transmittable. The test signal can serve to establish the test points of the respective test specimen which are electrically connected to one another, e.g., by electrical connections formed by conductive paths of the test specimen or by impermissible short circuits. It is also possible to determine in this manner whether impermissible discontinuities are present between predetermined test points which should be electrically connected to one another. Like impermissible short circuits, such discontinuities represent defects in the test specimen. If desired, test signals can also be used for measurement purposes, e.g., measurement of the properties of electronic components of the test specimens or whether such properties do not exceed predetermined tolerances, and so on. The test signals, or the absence of test signals which should be returning, are then evaluated in the testing circuit system of the testing device where the test signals are generated to determine whether the respective test specimen is free of electrical defects or contains defects. The defective locations of a test specimen can be displayed or can be expressed in terms of coordinates in some other fashion. Other possibilities also exist.

In the known testing devices of the type indicated above, (e.g., U.S. Pat. Nos. 4,443,756 and 4,528,500; German Offenlegungsschrift 23 64 786; German patent 33 43 274; Jahrbuch der Deutschen Gesellschaft fuer Chronometrie e.V., Vol. 30, pp. 269–276; European patent application 0 130 350) each sensing point is constituted by the head or tip of a metallic contact pin which, for instance, consists of steel, copper-beryllium or the like. The contact pin can be a pin which is resiliently supported axially, or a bent or straight needle which functions as a bending spring or a flexing needle. It can also be an elastic contact pin. A common feature of the known contact pins is that they take up a relatively large amount of space. This restricts the application of such testing devices and their testing possibilities.

A testing device of the type referred to here is also known from the U.S. Pat. No. 4,585,991. It has sensing points for checking the functioning of test specimens and each sensing point is disposed opposite a contact area or test point of the test specimen in such a manner that test signals can be transferred between sensing point and test point. It has been found, particularly with very small structures, that test signals frequently cannot be transferred between sensing point and test point because the alignment between testing device and test specimen does not permit their transfer in all cases. At least some test points which are, in fact, correct are then indicated as being defective. In this fashion, also, test specimens which are technically intact are rejected as defective thereby increasing the manufacturing costs of such test specimens.

It is accordingly an object of the invention to provide a testing device which insures very high reliability of transfer during both transmission and receipt of test signals.

In a testing device for checking electrical or electronic test specimens, this object is achieved by means of the features set forth in claim 1. In particular, since at least two sensing points of the testing device are associated with a respective test point of a test specimen, the probability of an exchange of the test signals is increased. It is also especially advantageous that, because of the small center-to-center spacing of the sensing points, these are arranged in such a fine grid that the structures of the opposed test specimen, e.g., conductive path structures and pads of the test specimen, can be electromechanically imaged and visually or automatically checked for freedom from defects. With particularly small spacings of the sensing points, a grid-like image is obtained which allows defects in the test specimen to be readily detected.

A particularly preferred exemplary embodiment of the testing device is one in which the sensing points are constituted by the free front ends of metallic contact needles whose opposite ends rest against electrically conductive abutments provided on a plate which is manufactured on a semiconductor basis. It has been found especially advantageous that, in this embodiment of the testing device, the center-to-center distances of neighboring contact needles can be made very small so that extraordinarily high reliability of contact is achieved during the transfer of test signals between the sensing points and test points of a test specimen.

Furthermore, a testing device is preferred in which each sensing point has at least two doped regions extending to the end face of the sensing point. When this embodiment of the testing device is employed, such design makes it possible to determine whether a sensing point is in contact with a test point of a test specimen. The doped regions of the sensing point are conductively connected to one another electrically in the vicinity of the end face of the sensing point by the contact surface of the test specimen which is referred to as a test point. This connection can be ascertained in an appropriate, known manner. Thus, the sensing points in contact with the test specimens are not detectable before and during the testing procedure. Upon an error indication, it can accordingly be readily established whether this is due to a defective test point or a defect in the test specimen, or to insufficient contact between a sensing point and a test point.

Moreover, an embodiment of the testing device is preferred in which the abutments have at least two doped regions extending to the support area of the associated contact needle. The two doped regions of the abutment are conductively connected with one another electrically either upon inserting the contact needle in the testing device or upon loading of a contact needle by the counterpressure of a test specimen. In this manner, correct positioning of a contact needle in the associated abutment can be detected even without application of a test signal. By this means, also, error indications of the testing device based on improper contact between abutment and contact needle can be eliminated. A testing device designed in such fashion is thus characterized by particularly great functional reliability.

Other embodiments of the testing device are forthcoming from the remaining subclaims.

The expression "on a semiconductor basis" is understood to mean that the plate consists solely of a semiconductor or can also contain additional components or the like, for example, dopants, metallic coatings, and so on. The semiconductor can be an elemental semiconductor (an elemental semiconductor consists of a single chemical element, for instance, silicon) or a compound semiconductor (brit.: compound semiconductor; a compound semiconductor contains a plurality of chemical elements, e.g., GaAs) or another semiconductor.

Since sensing points, preferably all of the sensing points, are provided directly on a plate produced on a semiconductor basis, these sensing points can have extremely small center-to-center distances, and thus a density which has not been achievable by far until now (density=number of sensing points per unit area). Using suitably thin contact needles, high sensing point densities can likewise be obtained in the testing device of claim 4 since, by means of abutments on the plate manufactured on a semiconductor basis, hereinafter referred to as H-plate, smaller center-to-center distances of neighboring contact needles are possible than in conventional testing devices with contact needles. It is further possible to provide contact needles in a testing device as well as sensing points formed by the, or the at least one, H-plate. Test specimens, for instance, can then be simply checked in that an initial check is made using only locations contacted by contact needles. The test specimen is subsequently moved closer to the at least one H-plate so that now the sensing points provided on the same can participate in a second check together with the contact needles. It is possible, however, and in many cases advantageous, to provide the sensing points of the testing device on its at least one H-plate only or on contact needles only.

The testing device can expediently include a testing circuit system which performs the electrical check of the respective test specimen and has circuit elements for electrical connection of the sensing points of the testing device to the testingcircuit system. During checking of a test specimen, test signals generated by the testing circuit system can be transmitted between sensing points of the testing device and oppositely disposed test points of the test specimens. The test signals can be evaluated in the testing circuit system to establish whether or not the test specimen is free of electrical defects. This testing circuit system of the testing device is preferably at least partially, often expediently in its entirety or essentially in its entirety, integrated in the at least one H-plate. The H-plate can consist of a single constituent, preferably a wafer or a chip. However, it can also be composed of a plurality of constituents, preferably a plurality of wafers or chips, which are assembled to form the H-plate, e.g., by adhesively connecting the constituents to one another with practically no spacing or arranging the same on a common surface of a carrier to thereby form the H-plate by direct connection of the constituents to each other or via the surface which carries them. In many cases, it is further expedient for the testing device to have at least two H-plates which are disposed in a carrying device at spacings from one another, for example, when a plurality of test specimens are to be checked simultaneously by means of the testing device. An H-plate of the testing device is then respectively associated with each of the test specimens to be checked simultaneously. In the case of test specimens whose test points are distributed over zones which have not insignificant spacings between them, it is possible for an H-plate of the testing device to be associated with each such field or group of fields for testing.

When the H-plate is formed as a chip, it can, for instance, have the size of a wafer. One can then denote it as giant chip, at least in many cases.

The testing device can be manufactured economically and have an extremely large number of sensing points. Advantageously, it can contain many thousands of sensing points, particularly hundreds of thousands or millions or even many millions of sensing points. The costs of the testing device per sensing point are or can be substantially less than the costs for conventional testing devices. The testing device of the invention is also less susceptible to trouble and can be structurally smaller and more compact than conventional testing devices and also opens new possibilities for the testing of test specimens.

Instead of contacting test points with sensing points, it is thus often expedient for all or some of the test points of test specimens to be sensed by sensing points of the testing device without contact. This is understood to mean that the testing signals can be transmitted without contact from the sensing points to the respective, oppositely disposed test points arranged at a spacing therefrom and can be received from the test points, without contact, by the associated sensing points. It can also often be expedient to no longer contact a pad, an end zone of a conductive path or another location of a test specimen with a single, respective sensing point as heretofore but, instead, to achieve contact or sensing without contact several times or many times simultaneously by means of sensing points, i.e., to provide correspondingly many test points at the respective location of the test specimen and thus increase the reliability of the test.

New areas of testing not accessible until now when testing with conventional testing devices having contact pins can also be opened. Among others, more miniaturized and highly integrated microelectronic devices, which could not be tested by the conventional testing devices containing contact pins, can be simply checked using testing devices according to the invention. Furthermore, the sensing points can be arranged on such a fine grid that the conductive path structures and pads of the test specimen which are freely disposed opposite the sensing points can be mapped in a grid-like fashion and visually or automatically checked for freedom from defects.

Preferably, at least the front side of the H-plate, or of at least one H-plate, of the testing device has a micromechanically produced structure. It is preferred that the sensing points and/or the abutments for contact needles be arranged or provided at micromechanically produced structures of this surface.

The H-plate is preferably designed with a respective semiconducting zone, which has at least one p region and/or at least one n region, for some, particularly advantageously all or almost all, of the associated sensing points. It is preferred for such region or regions to be highly doped. A p region is understood to mean an electrically conductive region of the H-plate which was produced by doping or some other procedure and has an excess (majority) of holes of positive polarity (also referred to as defect electrons). An n region is understood to mean an electrically conductive region produced by doping or some other procedure and having an excess of electrons. In this connection, it is mentioned that the semiconducting material of the H-plate or its constituents can be undoped or entirely doped or doped in selected areas.

The H-plate or, when it is composed of a plurality of constituents, each such constituent is preferably manufactured as a single crystal or on the basis of a single crystal of a metalloid, that is, a semiconductor, either in unilayered or multilayered form. It is preferred to use metalloids having good elastic properties, including elemental semiconductors of a single element (e.g., Si, Ge) as well as compound semiconductors containing two or more elements (e.g., GaAs). Silicon is particularly advantageous.

In many cases, the H-plate or at least one of its constituents can be polycrystalline or, in special situations, can be manufactured amorphously on metalloid basis, i.e., on semiconductor basis.

In preferred embodiments, at least some, preferably all or almost all, sensing points or abutments are provided on projections at the front side of the least one H-plate facing the respective test specimen. These projections are preferably produced micromechanically. They are preferably approximately cylindrical with round or polygonal, e.g., approximately square, cross sections, for example, or can have other shapes. They preferably taper along at least part of their lengths, e.g., as conical frustums, cones, pyramidal frustums, pyramids or the like.

At least some, preferably all or almost all sensing points are advantageously associated with a zone of the H-plate having a p region and/or an n region which cooperates in conduction of the test signals transmitted by this sensing point. Alternatively, the p region or n region of such a zone can form the respective zone itself. Such a region is preferably a p region or n region of an electrical component integrated in the respective H-plate, particularly a transistor or diode which functions or cooperates to switch, block or rectify the test signals conducted from the testing circuit system to the associated sensing point and, from the latter, to the testing circuit system. Such an electronic component is integrated in the respective H-plate or the respective constituent thereof and thus forms a component of the testing circuit system itself.

When the testing circuit system is entirely or partially integrated in the at least one H-plate of the testing device, the respective electronic components, conductive paths or the like can be integrated at the front side and/or the rear side and/or in the interior of the H-plate or the respective constituent or constituents. Electrical conductors such as conductive paths or the like can be formed by metallic coatings, through contacts or other measures employed for microelectronics. Micromechanically produced projections of the H-plate have outstanding elastic properties comparable to those of spring steel particularly when the individual H-plate or each of its constituents is manufactured on the basis of a silicon single crystal.

Projections with sensing points, or the locations of the H-plate or its constituents serving for the electrical connection of contact needles, can also be in the form of straight or curved bending springs such as resilient rods, leaf springs, resilient tongues, elastic membranes or the like.

Depending upon the test specimen and the type of test, all or only some sensing points of the testing device can, by appropriate programming of the testing circuit system, participate in testing of the test specimen. Programming of the testing circuit system for a series of identical test specimens can, for instance, be carried out automatically in principle, as with the known testing devices, by using a defect-free test specimen.

For contactless transmission and reception of test signals via sensing points of the testing device, these sensing points are preferably in the form of small coils which are micromechanically produced from the respective H-plate or the respective constituent on the same and serve as transmitting antennas or receiving antennas for test signals. These coils can be extremely small with maximum diameters of, for example, 1 to 50 micrometers, or smaller or larger diameters. Their distances from the respective test specimen during testing can be so small that, when the respective coil is supplied with alternating current or a series of pulses, only a narrowly delimited test point whose diameter is no larger, or only slightly larger, than the diameter of the coil is effectively subjected to the electromagnetic field generated by the latter so that a low electrical voltage is here induced at this test point. At least one other such coil can be oppositely disposed at a spacing to another location of the respective conductor of the test specimen. The test current induced in this electrical conductor then induces a test current or test voltage, which is evaluated by the testing circuit system of the testing device, in the corresponding at least one other coil of the same or another H-plate with the at least one other coil serving as a receiving antenna.

Electromagnetic fields can thus serve for contactless transfer of test signals between sensing points and test points. However, it is conceivable and possible to provide other means for this purpose. For example, capacitive coupling can be established between between a respective sensing point and an oppositely disposed, spaced test point of the respective test specimen. Alternatively, charge carriers such as ions or electrons can be transferred between a sensing point and a test point, for instance, by point discharges via semiconducting or metallically coated tips micromechanically produced on the at least one H-plate.

When sensing points are formed by the front ends of contact needles, these contact needles can contact electrically conductive p regions and/or n regions or metallic coatings of the at least one H-plate for electrically connection thereof.

In particular, the contact needles can be curved needles, straight rigid pins or so-called flexing needles. Flexing needle is understood to mean a straight needle which, in response to a sufficiently large axial force, bends at the free end thereof in contact with the test specimen and thus is axially resilient.

The sensing points of the testing device are preferably arranged on such a fine grid that the testing device can be used for the testing of test specimens of different size up to a maximum test specimen size. The density of the sensing points can be so great that conductor structures on the surface of the test specimen opposite the sensing points can be distinguished. In practice, one can then obtain an image, which can be digitally stored if desired, of the respective conductor structure of the test specimen on the surface of the same opposite the sensing points of the testing device. The image can be visually or automatically compared with a reference image of the conductor structure and, from the comparison, a determination can be made as to whether the respective test specimen is free of defects or contains defects with respect to such pictured conductor structure. This imaging method is particularly well-suited for unequipped printed circuit boards which are coated with conductive paths or the like on the surface only, or for unilayered chips. However, this imaging method also comes into consideration for other test specimens. This provides greater tolerances in the position of the test specimen relative to the sensing points. If desired, the position of each test specimen relative to the field of sensing points can be determined and the testing circuit system can be mathematically reprogrammed to the position of the individual test specimen so that this relative position is uncritical. This applies also when no image of the conductor structure is generated but only sections of the conductor structure. By way of example, each test specimen can have one or more points whose positions are determined in terms of their coordinates by an optical system, by at least one sensing point or by other means, e.g., electrical means. The computer recalculates the testing program for the respective test specimen in accordance with these coordinates if these coordinates deviate from the reference coordinates.

The testing devices of the invention can serve with particular advantage for the checking of unequipped printed circuit boards and of chips with very small pads. However, they can additionally serve for the checking of other electrical or electronic test specimens, e.g., for the checking of equipped printed circuit boards.

As mentioned, the respective H-plate can be unilayered or multilayered, or the semiconducting material constituting the same can be unilayered or multilayered. In the latter case, one can then denote it as multilayer plate or multilayer constituent. One can also denote this constituent or this H-plate as semiconducting constituent or semiconducting plate regardless of whether circuits are integrated therein, of whether or not it has metallic coatings for conductive paths, insulating layers or the like and through contacts and the like, and of whether or not it is unequipped. Conductive paths and contacts can, for example, consist of aluminum, gold or other suitable metals which can be applied using conventional methods.

while reference is made above to the micromechanical production of surface structures on the H-plate or its constituents, it is pointed out that the term "micromechanics" is known to the ordinary artisan. Attention is drawn, for instance, to the technical book "Mikromechanik" by Heuberger, Springer-Verlag Berlin Heidelberg New York London Paris Tokyo 1989 where various micromechanical production methods are also described.

Figure 2E:
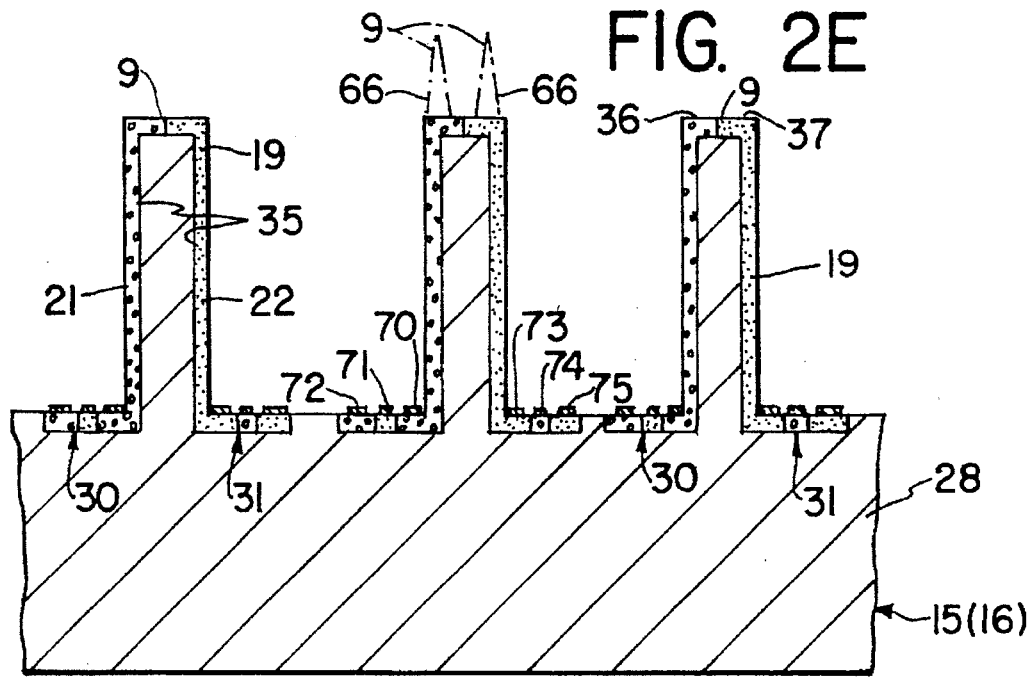
Figure 3:
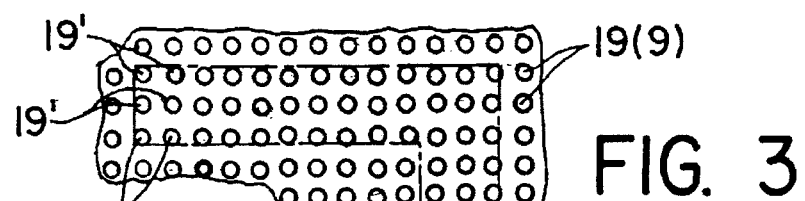
Figure 4:
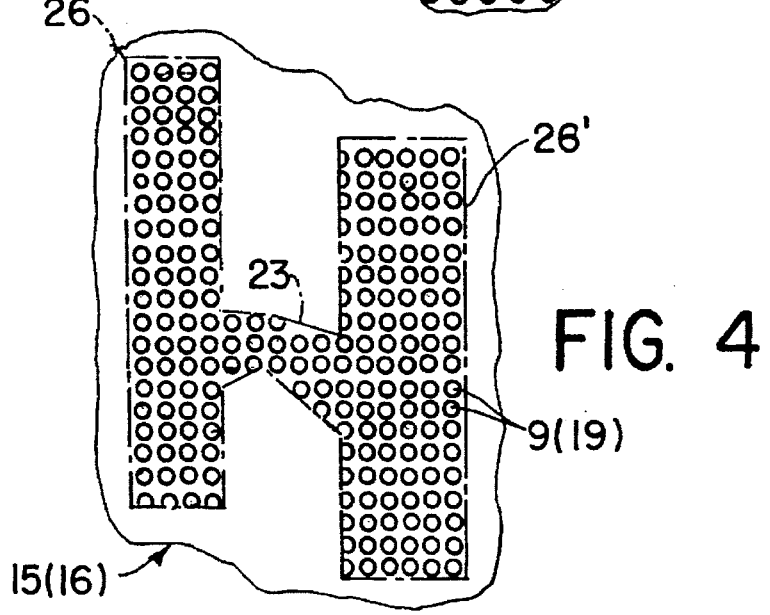
Figure 5:
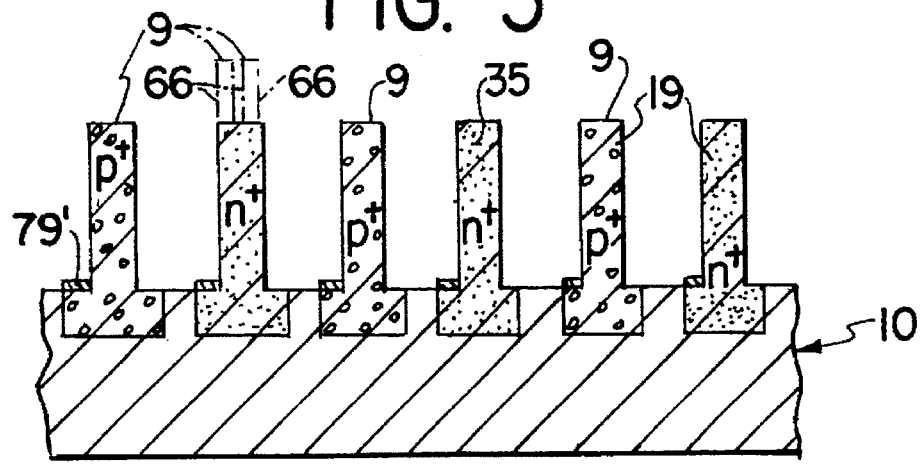
Figure 6:
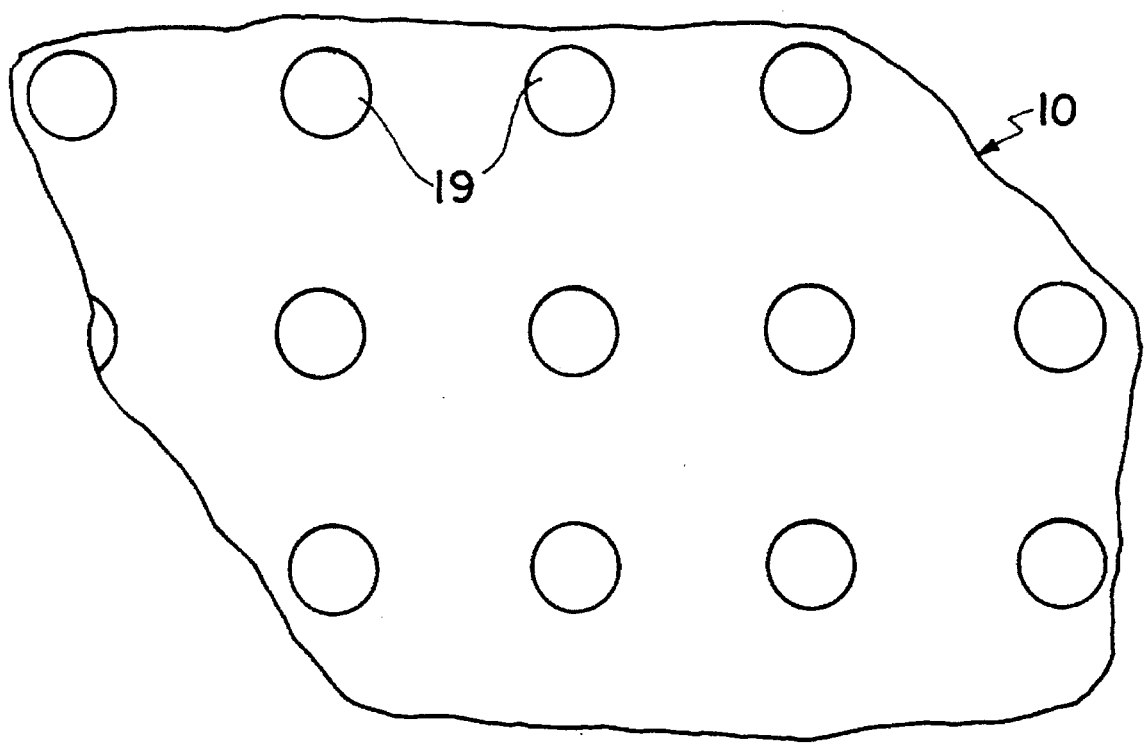
Figure 7:
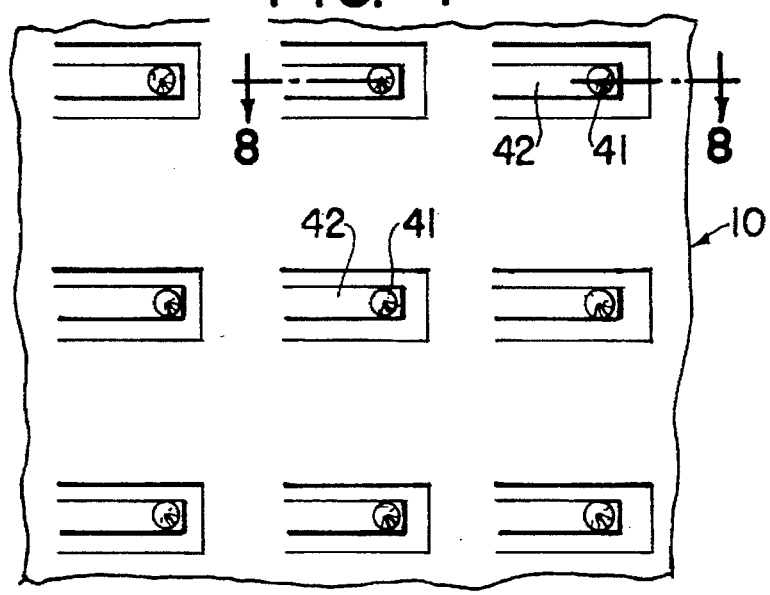
Figure 8:
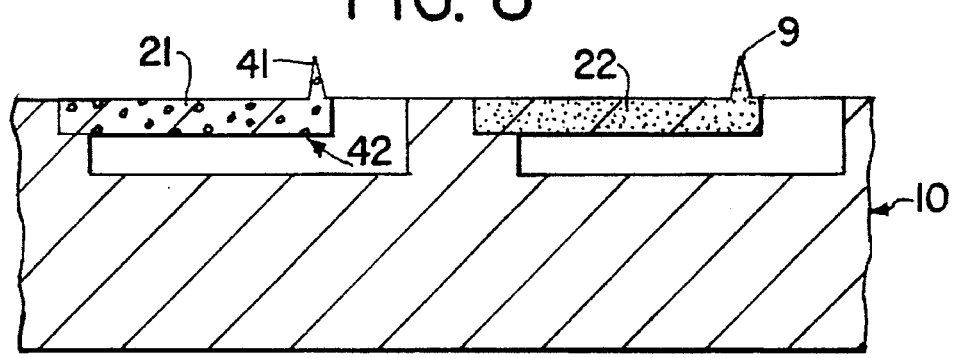
Figure 9:
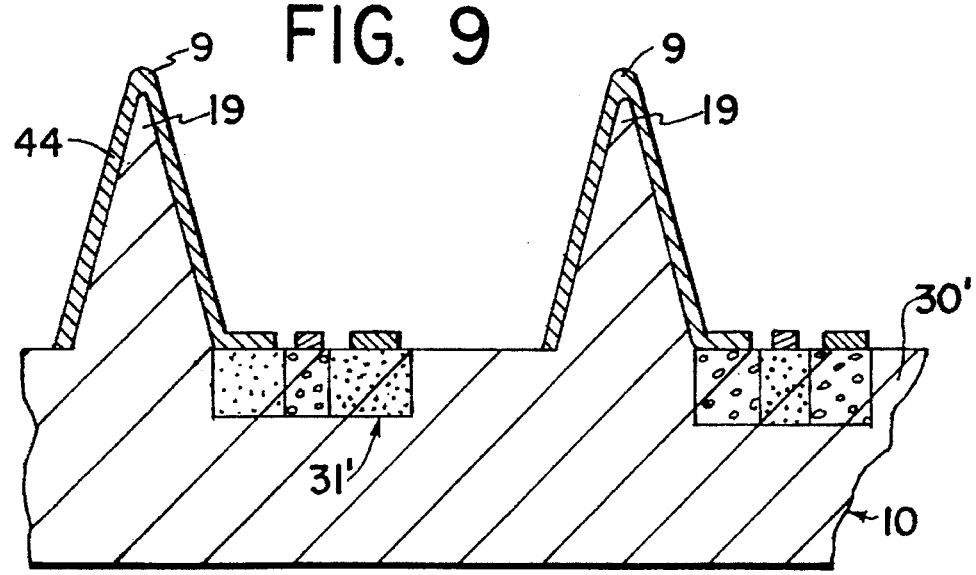
Figure 10:
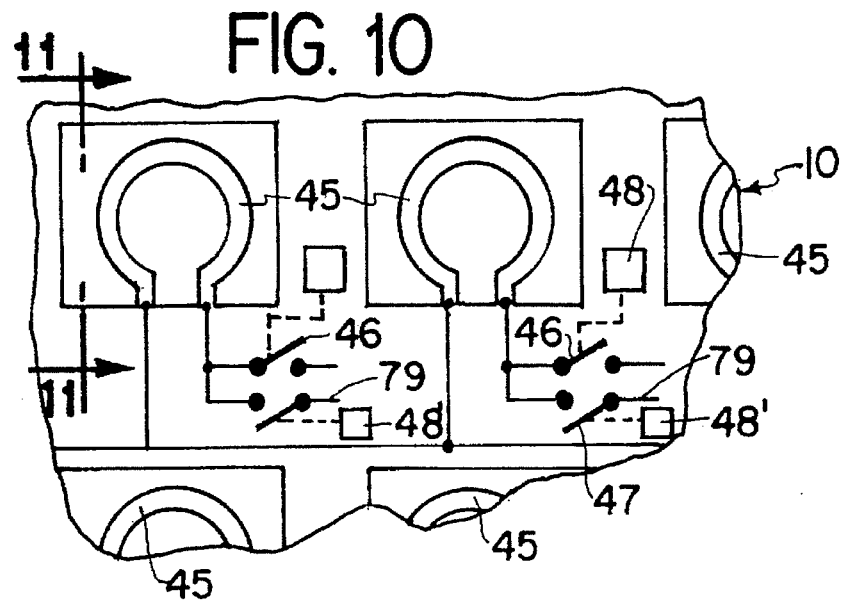
Figure 11:
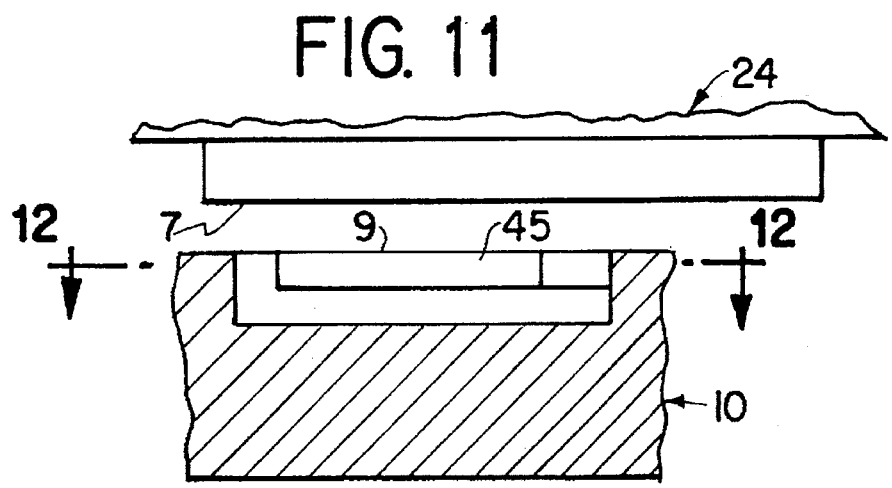
Figure 12:
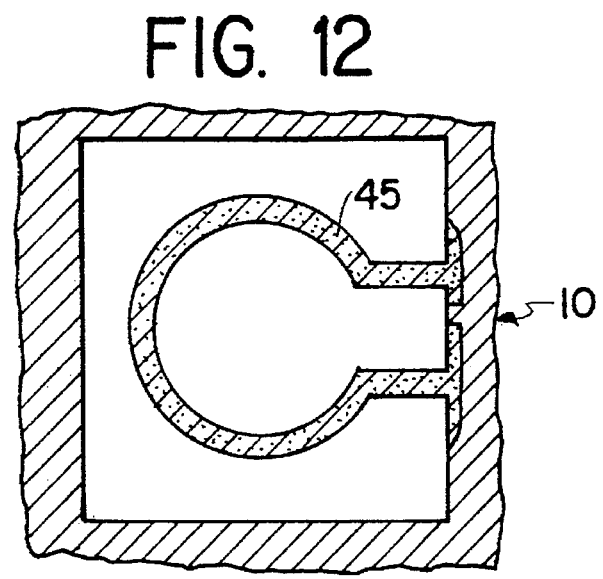
Figure 13:
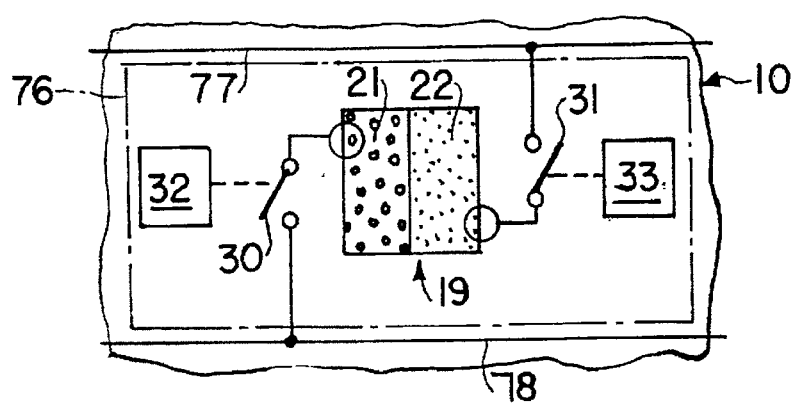
Figure 14:
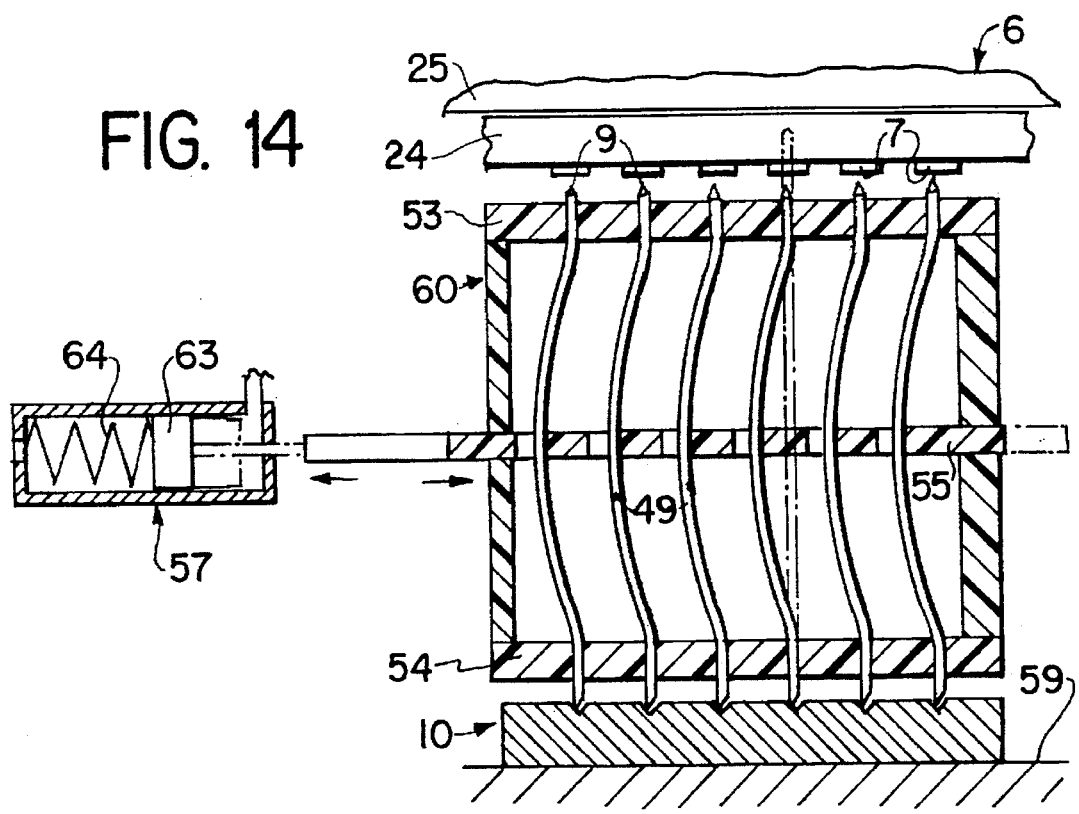
Figure 15:
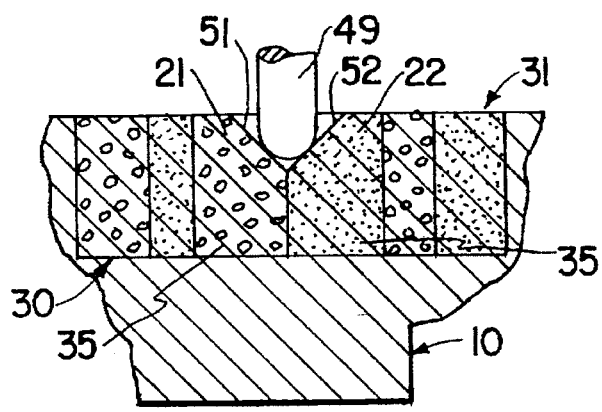
Figure 16A:
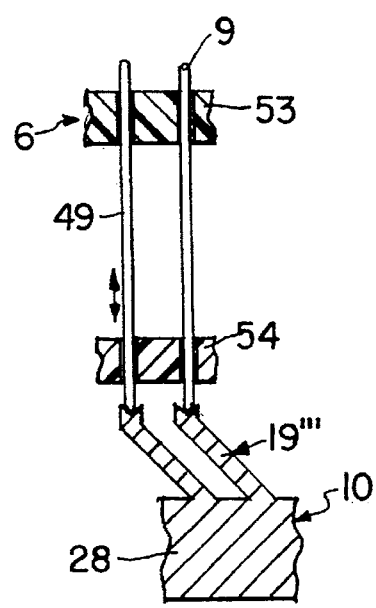
Figure 16B:
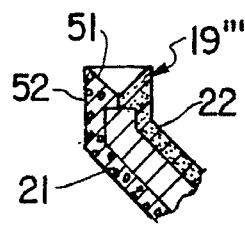
Figure 17:
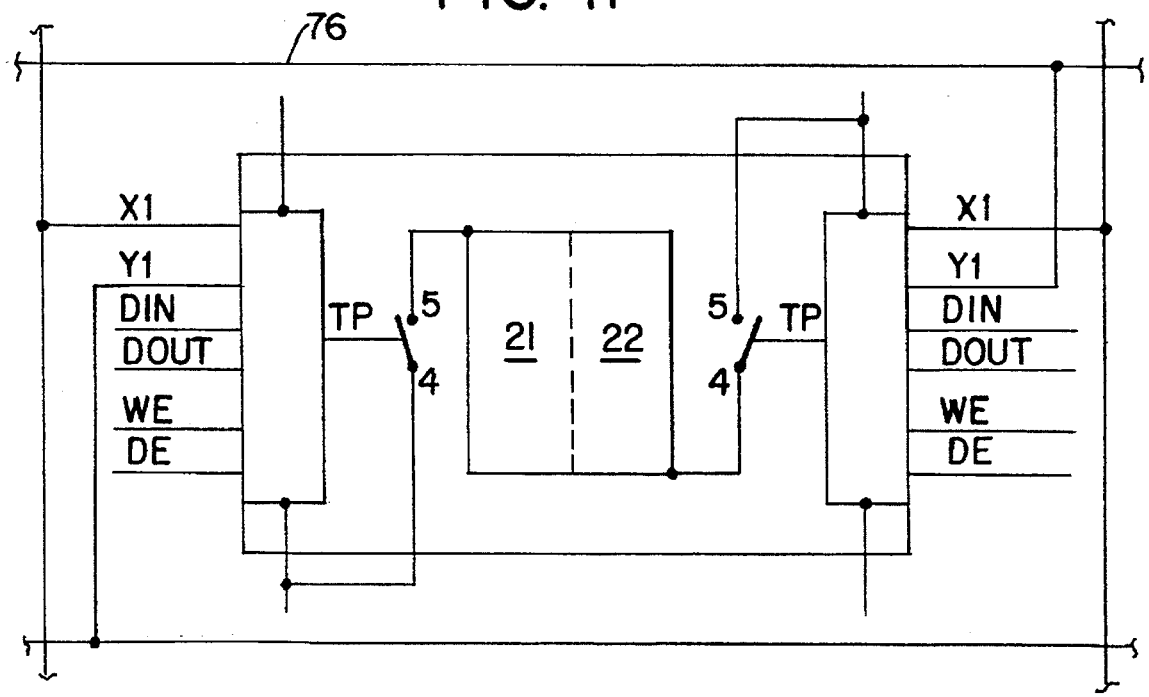

Exemplary embodiments of the invention are illustrated in the drawing. There is shown:

FIG. 1 a segmented, partially sectional side view of a cutout from a testing device according to an exemplary embodiment of the invention with a test specimen and its carrier indicated in dash-and-dot lines, FIG. 2A a top view of a cutout from the H-plate of FIG. 1 with only the projections illustrated and the conductive paths deleted, FIGS. 2B and 2C bottom views of plates of the testing device of FIG. 1, FIG. 2D a diagrammatic, oblique view of a small fragment of the H-plate of FIG. 2A showing only a single projection, the transistors defined by the p region and the n region of the projection, and their electrical connections to conductive paths, being schematically illustrated, FIG. 2E an enlarged, fragmentary sectional view of the H-plate of FIG. 1, FIG. 3 a top view of a cutout from an H-plate with a conductive path of a test specimen contacted by the same indicated in dash-and-dot lines, FIG. 4 a top view of a cutout from an H-plate where, to illustrate the possibility of grid-like mapping of conductive paths of a test specimen by the testing device, only those sensing points (projections) are shown which are short-circuited by the conductive paths of a test specimen indicated in dash-and-dot lines, FIG. 5 a fragmentary sectional view of a variant of an H-plate in accordance with another exemplary embodiment of the invention, FIG. 6 a top view of a cutout from an H-plate according to an exemplary embodiment of the invention, FIG. 7 a top view of a cutout from an H-plate in accordance with a further exemplary embodiment of the invention, FIG. 8 an enlarged, fragmentary sectional view of the H-plate of FIG. 7 seen along the section line 8—8, FIG. 9 a fragmentary sectional view of an H-plate according to another exemplary embodiment of the invention, FIG. 10 a top view of a cutout from an H-plate in accordance with a further exemplary embodiment of the invention with some circuits which are integrated therein indicated by wiring symbols, FIG. 11 a fragmentary sectional view of the H-plate of FIG. 10 seen along the section line 11—11 with a cutout of a test specimen also shown, FIG. 12 a sectional view of FIG. 11 seen along the section line 12—12, FIG. 13 a top view of a cutout from the H-plate of FIG. 2A showing only a single projection and illustrating cutouts of circuits which are connected to its p region and n region, the circuits being integrated in the H-plate and symbolized by electrical symbols, FIG. 14 a partly sectional side view of a testing device with contact needles for testing a test specimen shown in side view, the contact needles being supported on an H-plate, and means for stressing the contact needles being illustrated schematically and partly in section, FIG. 15 an enlarged view of a cutout from FIG. 14, FIG. 16A a sectional side view of a cutout from a variant of the testing device of FIG. 14, FIGS. 16B, C and D each a respective enlarged sectional view of a projection of the H-plate of FIG. 16A with two different embodiments being illustrated, and FIG. 17 a schematic circuit for regulating a testing cell.

It is first noted that in some of the Figures, but not all Figures, p regions are symbolized by small circles and n regions by points. The small circles are intended to symbolize the holes (defect electrons) which are present in the majority and the points are intended to symbolize the electrons which are present in the majority.

The testing device 6, of which a partly sectional, segmented cutout is shown in FIG. 1, and which is also partly illustrated by dash-and-dot lines only, has a plate 10—hereinafter also called H-plate—manufactured on a semiconductor basis. Its flat underside rests on a plate 12 which is fixed in a carrier 11 and is likewise manufactured on a semiconductor basis. These two plates 10 and 12 are complementally held in a recess 11' of the carrier 11. The plate 10, with seating as a plain bearing, can move vertically up-and-down in the recess 11' of the carrier 11 in the direction of the double-headed arrow A.

The two plates 10 and 12 are respectively assembled from a plurality of constituents 15,16 and 17,18 which are fixed to one another at their butt joints 13 and 14 by laser welding, for instance.

By way of example, each of these plates 10 and 12 can, in accordance with the bottom views thereof illustrated in FIGS. 2B and 2C, be composed of two rectangular constituents 15, 16 and 17, 18 of identical size which are assembled to form the correspondingly larger, likewise rectangular plates 10 and 12, respectively. If necessary, the plate 10 and the plate 12 can each consist of a single constituent making up the same or of more than two constituents which are assembled to form the same.

It is assumed for the description that the two plates 10 and 12 are respectively made up of the two constituents 15,16 and 17,18.

These constituents 15, 16, 17 and 18, which are also plate-like, can each be produced, in a manner to be described in more detail below, from a single crystal (monocrystalline) metalloid disc, i.e., on the basis of a semiconductor. One can accordingly denote it as semiconducting constituent regardless of whether or not electronic components such as gates, transistors, resistors or the like are integrated therein, and of whether or not metallic conductive paths, contact surfaces or other microelectronic components are integrated therein by coating or other means. Other parts such as, for instance, electrical and mechanical components, e.g., plugs, sockets, IC chips of the testing circuit system or the like, can still be attached to these constituents 15 to 18.

The constituents 15 and 16 can be identical and constitute modules from which the the H-plate 10 is assembled. Similarly, the constituents 17, 18 likewise constitute modules from which the plate 12 is assembled.

Each of the constituents 15, 16, 17 and 18 is thus produced on a semiconductor basis, preferably from one single crystal, which is preferably a silicon single crystal, respectively, although, if necessary, from another semiconductor which likewise is preferably a single crystal. Other suitable semiconductors also come into consideration.

Each constituent 15, 16, 17 and 18 has approximately cylindrical projections 19 (constituents 15 and 16) or 20 (constituents 17 and 18) which are arranged in matching grids on its upwardly facing front side and are normal to the plane of the respective plate. These projections are micromechanically produced by etching, for example, from the respective single crystal disc of originally constant thickness. According to FIG. 2A, these projections have a square cross section although other cross sections also come into consideration, e.g., round cross sections, preferably circular cross sections, in accordance with FIG. 6.

In this exemplary embodiment, the projections 19 and 20 have identical cross sections. However, the projections 19 in this exemplary embodiment are substantially longer than the projections 20 located below them on the plate 12.

After the micromechanical production of the structured front sides of these constituents 15, 16, 17 and 18, they can be subjected to microelectronic treatments for the production of electronic components, circuits and the like, and can also be provided with metallic coatings such as conductive paths and the like, as well as with through contacts. Alternatively, they can be provided with a layer-like (multilayer), preferably single crystal, structure even before the micromechanical treatment with the integration of electronic components such as gates and the like in the layers and with the application of metallic conductive paths and other metallic coatings. Such coatings can consist of aluminum, gold or the like, for example.

In this exemplary embodiment, the projections 19 of the H-plate 10 are doped in such a manner that, in accordance with FIGS. 2D and 2E, each projection 19 has a p region 21 and an n region 22 which together form a semiconducting zone 35 having a sensing point 9. The latter is constituted by the front face of the projection 19 half of which is formed by each of the regions 21, 22. The two halves of the frontal test point 9 thus respectively form a left pad 36 and right pad 37. These are from now on called "testpads". The regions 21 and 22 run from the front side of the projection 19, i.e., the testpads 36, 37, along two oppositely facing side walls of the projection 19 and to the main area 28 of the respective constituent 15 or 16. This main area 28 is understood to mean the area of the respective constituent 15 or 16 from which the projections 19, which are integral therewith, protrude. With the exception of its projections, the main area 28 thus forms the respective constituent 15 or 16 which can also be denoted as semiconducting constituent.

The p and n regions are preferably highly doped. As illustrated in FIGS. 2D and 2E, the regions 21, 22 of a respective doped region each form a respective switching transistor 30 and 31 which are integrated in this constituent 15 or 16. The conductive path connections 70 to 75 of these transistors 30 and 31 are illustrated in FIG. 2D in section and in FIG. 2E in the form of a cutout.

The diameters of the projections 19, as well as those of the projections 20, are advantageously very small, preferably 2 to 50 micrometers, or smaller or larger depending upon the requirements.

Such a constituent can have an extremely large number of such projections 19 or 20, preferably many thousand to several or many million such projections 19 or 20. Instead of forming each sensing point 9 of a projection 19 by a single surface—here the flat front face of the projection 19—the sensing point 9 can be constituted by a plurality of locations of the projection, for example, by the tips of a plurality of teeth 66 as indicated in dash-and-dot lines in FIG. 2E, or by a plurality of other prominences.

The projections 20 of the constituents 17 and 18 are arranged directly below the projections 19 of the constituents 15 and 16 to axially react against the axial contact forces exerted by the respective test specimen on the projections 19. The projections 20 of the constituents 17 and 18 make it possible to coat these constituents with conductive paths between the projections 20 and laterally thereof. Similarly, microelectronically produced electronic components such as diodes, transistors, gates and the like, which can form part of the testing circuit system, can be integrated in these constituents 17, 18. If this is not required, the constituents 17 and 18, that is, the plate 12, can be eliminated and the H-plate 10 can then rest directly on the bottom of the recess 11' of the carrier 11 which is then correspondingly shallower. In this case, it is often advantageous to provide projections, which can likewise be micromechanically produced and via which the H-plate 10 rests on the bottom of the recess 11', on the lower sides of the parallelepipedal main areas 28 of the constituents 15, 16 of the H-plate 10. Conductive paths produced by coating and arbitrary electronic circuits integrated in the main area, as well as other electronic components, which constitute parts of the testing circuit system, can then be provided at the underside of the H-plate also.

The semiconducting material from which the constituents 15 to 18 are produced is elastic so that, correspondingly, the projections 19 and the productions 20 are axially elastic. This makes it possible for all test points of a test specimen to be checked to be contacted with adequate force by projections 19 of the H-plate 10. Such a test specimen is illustrated in FIG. 1 at 24 in dash-and-dot lines. If the elasticity of the projection is too low, the projection can be arranged at an elastic portion or region of the H-plate 10 or the respective constituent 15,16, e.g., at a resilient tongue, an elastic membrane or the like. For the purpose of contacting the H-plate 10, this test specimen 24 is held and supported by a carrier 25 of the testing device 10 which is movable up-and-down and can be moved up-and-down by a non-illustrated lifting mechanism. The test specimen 24 can be pressed against the oppositely disposed projections 19 of the H-plate 10 with an adjustable force by means of the carrier 25 to thus cause the front sides of these projections 19, which form the sensing points 9, to electrically contact the associated test points 7 of the test specimen 24.

Inasmuch as approximately one-half of each sensing point 9 in this exemplary embodiment is constituted by a surface of the corresponding p region 21 while one-half is constituted by a surface of the n region, it is possible for each projection 19 to conduct positive and negative test signals, i.e., here positive and negative electrical currents and voltages. The transistors 30,31 function to connect and disconnect the p and n regions 21, 22 constituting the same to and from the remainder of the testing circuit system.

The H-plate 10 can be so large that test specimens of different size, up to a maximum size, can be tested. In the exemplary embodiment of FIG. 1, this is denoted in that the test specimen 24 is illustrated as being smaller than the H-plate 10. Test specimens which are larger than the illustrated test specimen 24 or smaller than this test specimen 24 can thus also be tested. Not all projections 19 disposed opposite a test specimen 24 need participate in the testing thereof. Instead, only some of the projections 19 disposed opposite a test specimen 24 can be connected to predetermined test points of the test specimen 24 to electrically connect the same to the testing circuit system of this testing device.

This is schematically denoted in FIG. 1 in that the illustrated segment of the test specimen 24 has three conductive paths 26, 26' and 26" which are to be contacted by projections 19. In the illustrated section, the conductive path 26 is contacted by two of the indicated projections 19, the conductive path 26' by three of the indicated projections 19 and the conductive path 26" also by three of the indicated projections 19. Each of these conductive paths can further be contacted by additional projections located in front of and behind the plane of the section. Due to the high sensing point density, the number of projections 19 which can contact such a conductive path can be very large.

In order to establish that such a conductive path 26 or 26' or 26" of the test specimen is free from defects, each such conductive path must be contacted by at least one projection 19 at both end portions thereof. By virtue of the very high sensing point density, each such end portion is contacted by a more or less large number of such projections 19, for instance, two to five hundred projections 19, as shown by way of example in FIG. 3 for the conductive path 26. This conductive path 26 is here shown in dash-and-dot lines, and each circle in the illustrated segment, shown in solid lines, of the front side of the H-plate 10 corresponds to a projection 19. These projections 19 are arranged in a fine, rectangular grid. The rows of the grid are spaced from one another by the same distances, and such distances are equal to the distances between the columns of this grid which intersect the rows at right angles. The sensing points 9 are disposed at the intersections of the rows and columns of the grid. This conductive path 26 is here accordingly contacted by a large number of these projections 19.

During testing, the conductive path 26—as well as every other conductive path—of the test specimen is checked for freedom from defects, i.e., that it has no interruption and that no short circuit to other conductive paths exists. To this end, the testing circuit system for the respective test specimen can be programmed so that only two sensing points 9 per conductive path can be connected, that is, activated, and all other sensing points in contact with the respective conductive path are disconnected, that is, remain inactive, during testing of this conductive path. The two sensing points 9 which can be activated per conductive path are the sensing points 9 associated with its end portions. Checking of such a test specimen can then take place in a conventional manner, e.g., in accordance with U.S. Pat. Nos. 4,443,756 and 4,528,500, and as in known testing devices where each conductive path is contacted by only two contact pins at its two end portions.

By virtue of the high possible sensing point density, the invention provides additional testing possibilities which reduce or eliminate the danger of testing errors. One of these possibilities resides in that the testing circuit system is programmed in such a manner that, of all the sensing points 9 constituted by the end faces of the corresponding projections 19 and contacting a conductive path of a test specimen, a plurality or multiplicity which are in contact with each end portion of the respective conductive path can be activated during testing of the test specimen. In the exemplary embodiment of FIG. 3, it is assumed that, by means of the testing circuit system, of all the projections 19 contacting the conductive path 26, only the six projections 19' contacting the one end portion of this conductive path and the six projections 19" contacting the other end portion of this conductive path can be activated during a testing cycle. During this testing cycle, the testing circuit system then determines whether an electrical short circuit established by the conductive path 26 exists between at least one of the projections 19' and at least one of the projections 19". If this is the case for at least one pair of projections 19'/19", the conductive path 26 is not interrupted. Testing must now be extended to determine whether this conductive path 26 forms an electrical short circuit, which is not supposed to be present, with at least one other conductive path or component of the test specimen. This test can involve a check by the testing circuit system as to whether any of the test points 7 of the test specimen associated with the programmed projections 19' or 19" is electrically connected to and, in particular, forms a short circuit with at least one test point of the test specimen lying outside the conductive path 26. If this is the case, an improper short circuit is present. When none of the projections 19' forms a short circuit with one of the projections 19", an improper interruption of the conductive path 26 exists. The coordinates of such defects can be detected for eventual repair.

The number of projections 19 is very large and their center-to-center spacings very small, that is, they are arranged at the intersections of a very dense grid which can, for example, have a grid dimension of 10 to 30 micrometers, or less or more. Consequently, this testing device 6 makes it possible to obtain an image of the conductive paths of the respective test specimen which are contacted by the sensing points 9 when the coordinates or images of all projections 19 forming electrical short circuits with one another via metallized areas of the test specimen are detected. FIG. 4 shows an example of this in which all projections 19, and thus the sensing points thereof, which form short circuits with one another via the test specimen are detected together with the corresponding coordinates of the grid. They can be stored in the form of their coordinates and/or represented as an image. In FIG. 4, only the projections 19 and sensing points 9 which form short circuits with other sensing points 9 via the test specimen are illustrated, and it can be seen that the two conductive paths 26 and 26' shown here can be represented pictorially by means of these sensing points 9. The image of the conductive paths 26 and 26' is here selected such that they are improperly connected to one another electrically by a metallic bridge 23, and it is observed that this improper connection can likewise be clearly seen in the image. The evaluation of such an image or the stored coordinates of the respective sensing points can be performed either visually or automatically in a suitable apparatus, through the agency of the testing circuit system itself if necessary, by comparison with a reference image.

Sensing of each conductive path of a test specimen and, if present, connections forming improper short circuits preferably takes at a plurality or a multiplicity of locations. This has the advantage that, when the one or other test point of the test specimen is not electrically contacted by the associated projection 19 or is not adequately contacted electrically, for instance, too weakly, testing of the test specimen nevertheless reliably indicates whether the test specimen is free of defects or whether an electrical defect is, in fact, present.

Using testing devices in accordance with the invention such as, for example, that of FIG. 1, it is also possible to perform numerical or other measurements on or with tests specimens, e.g., measurements relating to the maintenance of predetermined tolerances for electrical properties, to additionally or exclusively check test specimens for freedom from defects in this respect. When a test specimen contains integrated circuits, impedances, capacitances or the like, for instance, the properties of such electrical components, or all or at least one of their functions, can be measured and checked for freedom from defects which, as already mentioned, is understood to include the maintenance of predetermined tolerances, e.g., the magnitude of resistances and the like.

In this connection, it is noted that the invention allows such measurements to be carried out on test specimens of high measurement precision, especially when the testing circuit system is disposed in a small or most narrow space with short conductive paths. It is preferably entirely or essentially integrated in the at least one H-plate and/or in at least one semiconducting plate supporting the same. This is most advantageous for the checking of conductive paths of test specimens for freedom from defects.

Additional possibilities for connecting and disconnecting the sensing points 9 of the testing device of FIG. 1 are briefly described below for a single projection 19 with reference to an exemplary embodiment illustrated in FIG. 13. Two electronic switches 30,31 are connected to this projection 19 (and also to all the other non-illustrated projections 19 of the respective H-plate). The electronic switches 30, 31, which can be the transistors 30,31 shown in FIG. 2E, are integrated in the H-plate 10 and are symbolically indicated by their wiring symbols in FIG. 13. The switch 30 is connected to the highly p-doped region 21 and the switch 31 to the highly n-doped region 22 of this projection 19, and these regions 21, 22 simultaneously form regions of the transistors 30 and 31. The switch 30 is connected to a control component 32 associated with it alone and the switch 31 to the control component 33 associated exclusively therewith. Both control components 32,33 can likewise be integrated in the H-plate 10 and can, for example, be in the form of registers or modified registers. The projection 19, the electronic switches 30 and 31, and the associated control components 32 and 33 constitute a testing cell 76 indicated by a dash-and-dot boundary.

The H-plate 10 thus has integrated therein a number of such testing cells 76 equal to the number of its projections 19 because such a testing cell 76 is associated with each projection 19. The length of the edge of such a testing cell can, for instance, lie in the range of 5 to 50 micrometers but can also be smaller or larger. An individual testing cell 76 contains:

a) A twice-doped projection 19. The dual doping makes it possible to pass through positive and negative testing voltages and testing currents, i.e., testing signals;

b) The electronic switches 30 and 31 for connecting the sensing point 9 formed by this projection 19 to two testing conductors 77 and 78 which correspond to conductive paths produced by coating the H-plate 10 or its respective constituent 15 or 16;

c) The two control components 32 and 33 which are integrated in the H-plate 10 or its respective constituent and are preferably constructed as register cells or modified register cells for regulating the electronic switches 30, 31. These control components 32, 33 preferably contain logic gates and a respective static register. Their structure can, for example, correspond to that of the conventional or largely conventional memory cells (RAM). Preferably, two different control modes are provided:

I. Switching of the switches 30, 31 on the basis of information stored in the testing circuit system for the respective test specimen (storage mode).

II. Switching of the switches 30, 31 by addressing the testing cells 76 via non-illustrated address conductors (decoding mode).

These modes permit selective connection of all testing cells 76 of the testing device, or those programmed for testing of the respective test specimen, according to a pattern in the storage mode or, alternatively, rapid searching in the decoding mode. Such principles of the storage mode and the decoding mode require no further explanation for one skilled in the art.

d) Current supply conductors for the testing cell 76. The control components 32, 33 and the switches 30, 31 of an individual testing cell are galvanically separated and thus have discrete current supplies. These current supplies can be formed, for instance, by the testing conductors 77, 78 and two non-illustrated conductors.

e) Control and address conductors. The address conductors can, for example, also be denoted as conductors for addresses. For each testing cell 76, six additional control and address conductors are used for the p region 21 and the n region 22 separately as shown in FIG. 17.

I. X Addressing of the column of the grid in which the respective sensing point 9 is located.

II. Y Addressing of the row of the grid in which the respective sensing point 9 is located.

III. WE (Write Enable) Write signal for data storage.

IV. DIN (Data In) Data input channel.

V. DOUT (Data Out) Data output channel.

VI. DE (Direct Enable) Switching between storage mode and decoding mode.

The conductors I to V are of the type conventionally used in the production of IC memories. Conductor VI determines whether switching of the switches 30 and 31 of the respective testing cell 76 takes place by means of data stored in a memory of the testing circuit system (storage mode), which memory is preferably in the form of a register, or by means of the address provided.

Addressing of the testing cells can be performed in a conventional manner by decoding the rows and columns of the grid in a decoding unit of the testing circuit system. This decoding unit can be integrated in the, or in an, H-plate but need not be contained therein. For example, it can be integrated in the plate 12 or in an apparatus 40 or the like (FIG. 1) located externally of the plates 10 and 12 and electrically connected to the H-plate 10. The apparatus 40 can contain other parts of the testing circuit system or, in many cases, the entire testing circuit system and its electrical connection to the power grid.

An individual constituent 15, 16 can be in the form of a chip or wafer and its size can, for instance, be 50 mm×50 mm although it can be larger or smaller. A possible loss of individual sensing points of the testing device during checking of a test specimen, e.g., due to insufficient electrical contact with the respective test point of the test specimen, is insignificant in practice because of the high sensing point density. Thus, one-hundred percent contact with the test points is unnecessary when the plural or multiple sensing method is used.

Such a constituent 15 or 16 can contain an extremely large number of testing cells 76, e.g., several hundred thousand to several or many millions. The electronic components, conductive paths and the like integrated in an H-plate 10 or in a constituent such as 15 or 16 can be on the same side or on opposite sides of the H-plate or the constituent and/or inside the same.

Similarly to a conventional RAM, an individual constituent can be regulated via address and data conductors and suitable control conductors as, for example, known in principle for the addressing and reading of sensing points from U.S. Pat. Nos. 4,443,756 and 4,528,000.

Using, for instance, a testing device having a large number of testing cells 76 in accordance with FIG. 13, checking of a test specimen whose conductive paths are contacted at their respective end portions by a more or less large number of activable, i.e., connectible, sensing points 9 can, for example, be accomplished among other ways by the following procedure to be described with reference to FIG. 3. A testing signal is sent to the p region 21 of a projection 19' by closing the associated switch 30. While this switch 30 remains closed so that the testing signal is continuously transmitted to this projection 19', the switches 31 of the testing device associated with all remaining projections 19 programmed for activation are successively closed for a short period of time. Thereafter, the mentioned switch 30 is again opened. This is denoted as a testing cycle with the respective projection 19'. Corresponding testing cycles subsequently take place, or can take place, with the remaining five projections 19'. If freedom from defects is established during at least one of these testing cycles or a predetermined number of the testing cycles, this conductive path is declared free of defects and similar testing of the next conductive path is undertaken, etc., until all conductive paths have been declared free of defects. To save time, checking of a conductive path can be discontinued as soon as its freedom from defects has been established. On the other hand, when a conductive path has been found defective, this is registered and checking of the test specimen can either be discontinued or can continue if all defects of the test specimen are to be registered. By way of example, defects found can be displayed or expressed in accordance with the coordinates of the grid.

Instead of discontinuing the checking of a conductive path such as, for instance, the conductive path 26 as soon as its freedom from defects or the presence of a defect has been established, checking of this conductive path can be continued and the additional signals indicating its intactness or its defects then change nothing in this result.

It is also mentioned that the semiconducting disc from which the individual constituent 15 or 16 is produced can already be p-doped or n-doped, or even undoped, prior to micromechanical and microelectronic processing.

The height of the projections 19 is preferably of the order of 0.1 mm but can be larger or smaller. Due to their very small cross-sectional dimensions, they have adequate resilience axially. Furthermore, the main portion of the H-plate or the respective constituent from which the projections protrude can yield elastically therewith adjacent to the projections. In this connection, it is noted that silicon has particularly good elastic properties which are comparable to those of steel so that it is especially advantageous for the H-plate 10 to be manufactured on a silicon basis, particularly from a silicon single crystal.

The fragment of an H-plate 10 illustrated in FIG. 5 differs from that of FIG. 2 essentially in that each projection 19 is either entirely p¾+¾-doped or n¾+¾-doped. These projections 19 can likewise be arranged on a uniform grid at the intersections of the grid. The doping alternates from projection 19 to projection 19 in each row and column of the grid so that in a particular line of the grid neighboring projections are respectively p¾+¾-doped and n¾+¾-doped. Accordingly, not every projection 19 can be connected with every projection 19 for the checking of a test specimen in the testing circuit system but only p¾+¾-doped projections with n¾+¾-doped projections. Furthermore, in this exemplary embodiment of FIG. 5, each projection 19 is illustrated as being highly doped throughout. Depending upon the depth of doping, only part of an individual projection can be highly doped and this highly doped zone connected to a conductive path such as the conductive path 79'. These doped zones of the projections 19 can function as transistors for connecting their sensing points.

FIGS. 7 and 8 illustrate fragments of a unitary or multipartite H-plate 10 in which the contact elements serving to contact the test points of test specimens are in the form of tips 41 of resilient tongues 42. The resilient tongues 42, as well as their contact tips 41, can be integral with the remaining semiconducting material of this H-plate 10. In practice, these resilient tongues 42 constitute leaf springs which, in this exemplary embodiment, extend in the plane of the H-plate 10, and they are formed by micromechanical processing of the original monocrystalline disc, preferably a silicon disc, of the respective semiconductor. Each tongue 42 with its contact tip 41 has a uniformly highly doped region 21 or 22. In the rows and columns of the respective grid, neighboring tongues 42 with contact tips 41 are differently doped and, in fact, once again alternately as p¾+¶ and n¾+¾. Thus, the same applies to this H-plate 10 as to the H-plate 10 of FIG. 5. The elastic displacements of the contact tips of FIGS. 7 and 8 can be larger than those of the cylindrical projections 19 of FIG. 5.

It is also possible to design the tongues 42 such that each tongue 42 carries two neighboring contact tips. One of these contact tips is then p¾+¾-doped and the other n¾+¾-doped. Correspondingly, these p and n contact tips are connected, via similarly doped zones of the tongue 42, to electrically conductive paths constituted by coatings, and they can be regions of integrated transistors as is naturally also the case for the regions 21, 22 of FIG. 8. As indicated by dash-and-dot lines in FIG. 5 for one projection 19, the respective sensing point 9 can be formed by the free ends of a plurality of protuberances 66 of the corresponding projection 19 instead of the end face of the projection 19.

In the embodiment of FIG. 9, the monocrystalline H-plate 10 manufactured on a semiconductor basis, or its respective constituent if it consists of a plurality of constituents, has electromechanically produced projections 19 on its front side. These projections 19, which converge in a direction away from the flat main portion 28 of this plate, need here not themselves be doped (although they can be doped) because the sensing point 9 of each projection is formed by a metallic coating. To this end, each projection is here provided with a metallic cap 44. Each such projection 19 serves to contact the test points of test specimens by means of the tip of its cap 44 which forms the sensing point 9.

Each cap 44 is here connected to a respective transistor 30' or 31' which functions to electrically connect it to the testing circuit system and is integrated in the H-plate 10. Every other transistor serves to switch on positive testing signals and the remaining transistors to switch on negative testing signals. Thus, as regards the procedure for checking test specimens, the same explanations as those for the H-plate of FIG. 5 can apply. However, it is also possible for positive and negative testing signals to be selectively conducted to each cap 44 by connecting it to two transistors integrated in the H-plate and providing for one to switch on positive testing signals and the other to switch on negative testing signals. Regarding the performance of tests, the explanations outlined with reference to FIG. 13, as well as FIGS. 2D and 2E, can then apply.

FIGS. 10–12 show fragments of a unitary or multipartite H-plate 10 of a testing device according to a further exemplary embodiment of the invention where the sensing points 9 do not function to mechanically contact the test points of the test specimens. Instead, this H-plate 10 serves to contactlessly sense test specimens, such as 24, by means of coils 45. These coils 45 are here micromechanically made integral with the remainder of the H-plate 10. In this exemplary embodiment, each coil 45 has a uniformly highly doped region, that is, a p-doped or n-doped region, which serves as an electrical conductor. Alternatively, it can have a metallic coating which functions as an electrical conductor. In the former case, it can only be supplied with testing signals of the same polarity, e.g., pulse trains delivered by the testing circuit system. In the latter case, it can be supplied with alternating current. Each such coil 45 here has a single winding which is not fully closed, and the two ends of the winding are connected to a voltage source common to all of the coils 45. All of the coils are connected in parallel and are individually connectible to the common voltage source, independently of one another, via respective switches 46 which are shown in FIG. 10 as transistors and are integrated in the H-plate 10. Each coil 45 can thus serve as a transmitting antenna for sending an electromagnetic alternating field to the oppositely disposed test point 7 of a test specimen 24, or can be connected to a testing conductor 79 of the testing circuit system as a receiving antenna by means of a switch 47 which likewise constitutes a transistor. The switches 46, 47 are regulated by associated control components 48, 48' which can be registers, for example. Instead of providing the coil 45 with a single winding, it can have a plurality of windings and, depending upon the micromechanical possibilities, it can be designed not only as a coil which lies in a plane but as a three-dimensional coil with a plurality of superimposed windings.

Contactless checking of a test specimen can, for instance, be accomplished as follows. Depending upon the size of the test specimen and its test points, all or only some of the coils 45 can be programmed into the program which connects them to the testing circuit system. Each of these programmed coils 45 can now serve as a transmitting antenna and can be switched on for this purpose by its associated switch 46. It is generally expedient to connect only a single coil 45 to the voltage source and, once this has been done, the remaining coils 45 are successively alternatively connected to a receiving circuit as receiving antennas. A current detectable by the testing circuit system flows through each receiving coil 45 only when it is opposite a test point 7 which is electrically connected to that test point 7 of the test specimen opposite the momentary transmitting coil 45, that is, the same conductive path as the transmitting coil or a metallic surface of the test specimen which forms a short circuit with such path. The "receiving coils" are successively checked to determine which of these are connected to the test point of the test specimen opposite the respective "transmitting coil" by the same metallic, conductive surface of the test specimen. All coils disposed opposite test points of the test specimen can then be successively and alternatively switched to transmitting coils, and respective checks can be made as to which of the coils 45 now functioning as receiving coils are situated opposite the same metallic, conductive portion of the test specimen. In this manner, possible defects in the test specimen can, in preferred fashion, be detected in terms of their coordinates.

By means of such coils 45, it is possible here also to perform a single, plural or multiple check of each electrically conductive portion of the test specimen and, if necessary, to also display or store an image of the metallic surface portions of the respective test specimen. These coils can have extraordinarily small dimensions, e.g., diameters of the order of 5 to 100 micrometers or, if necessary, more or less. These coils 45 can again be arranged in a uniform grid on the front side of the H-plate 10, for instance, in a grid having a grid dimension of 10 to 100 micrometers or smaller or larger grid dimensions.

FIGS. 14 and 15 illustrate an exemplary embodiment of a testing device 6 which differs from the preceding exemplary embodiments in that its sensing points 9 are not formed by projections of an H-plate 10 but, instead, by metallic contact needles 49 and, in particular, the front ends thereof, e.g., by needles 49 of steel, copper-beryllium or other elastic metals having good electrical conductivity.

The rear, rounded ends of the contact needles are disposed in cup-like, here conical, recesses 51—hereinafter referred to as cup—of an H-plate, e.g., a semiconducting plate 10 based on silicon, particularly a wafer or chip. Each such cup 51 forms an abutment 52 for the corresponding contact needle. In this exemplary embodiment, each cup 51 is located in a small semiconducting zone 35 of the H-plate 10 associated exclusively with such cup 51. Half of the semiconducting zone 35 is highly p-doped (region 21) and the other half highly n-doped (region 22). The dividing surface between these two doped regions can, for example, be a symmetry plane of the cup 51. As in the exemplary embodiment of FIG. 13, each of these two regions 21, 22 can be connected to a respective electronic switch 30, 31 which is integrated in the H-plate 10 and is formed by the respective region 21 or 22. Each switch 30, 31 can be connected and disconnected for the testing of test specimens via non-illustrated control components such as registers or the like associated therewith. With respect to the performance and evaluation of a test, the explanations outlined in regard to FIG. 13 can thus apply here as well.

Instead of allowing the individual contact needles 49 to rest on two differently doped regions of the H-plate 10 simultaneously, it is also possible to permit them to rest on only a uniformly doped region, that is, only a p or only an n region. The explanations given with reference to FIG. 5 regarding the performance of a test can then apply.

In this exemplary embodiment, the contact needles 49 are bending needles and their front end portions, immediately below their upper tips which form the sensing points 9 and are here respectively located opposite a test point 7 of a test specimen 24 held on a carrier 25 vertically movable up-and-down, are guided in an upper guide plate 53 of a testing adapter identified in its entirety by 60. Their rearward end portions, near their lower free ends, are guided in a rearward guide plate 54 of the adapter 60.

The upper and lower guide plates 53, 54 have through bores in which the contact needles are guided with sliding clearance.

Central portions of these contact needles 49 further pass through apertures of a stressing plate 55 which is horizontally movable back-and-forth and serves to stress the contact needles 49. Such apertures are substantially larger in diameter than the apertures in the guide plates 53, 54.

Immediately below the lower guide plate 54, the contact needles 49 have enlargements in the form of indentations which prevent the needles 49 from shifting upwards out of their unstressed, normal positions. Prior to checking a test specimen 24 held on the carrier 25, the stressing plate 55 is drawn to the left by an adjusting motor 57 which constitutes a piston-and-cylinder unit and can be connected to a source of pressurized air. As a result, the upper contact tips of the contact needles 49, which form the sensing points 9, are drawn downwards. The test specimen 24 is then moved so far down that it contacts, or virtually contacts, these contact tips. The stressing plate 55 is thereupon pushed to the right by the adjusting motor 57 whereby the contact tips press against the test points 7 with a predetermined force to establish reliable electrical contact. In this manner, their lower ends also come into corresponding, reliable electrical contact with the recesses 51 of the H-plate 10 which receive them. Now checking of the test specimen 24, e.g., a chip, for freedom from defects takes place by means of the testing circuit system of this testing device. Among other ways, electrical testing can be performed as known per se from conventional testing devices whose testing adapter includes metallic contact pins.

By way of example, the micromechanically produced recesses 51 can also be provided with metallic coatings which are electrically insulated from one another by the H-plate and are connected to the testing circuit system by transistors or the like which are again preferably integrated in this H-plate. Here, also, it is preferred for the testing circuit system to be entirely or substantially entirely integrated in the H-plate. The H-plate 10 is affixed to a carrier 59 of the testing device which carries the H-plate 10 while the carrier 25 serves to hold the test specimen 24.

The contact needles can have very small diameters of 0.01 to 0.2 mm, for example, and can be disposed on a grid of, for instance, 0.0254 mm, or on a coarser or finer grid, or in another desired manner.

The piston 63 of the adjusting motor 57 is movable to the left by pressurized air and to the right by a spring 64 when the pressurized air is interrupted.

In the exemplary embodiment of FIG. 14, the sensing point density can readily be made much greater, e.g., so great that, in the illustrated sectional plane, an individual conductive path or an individual pad of the test specimen 24 is contacted by a plurality of contact needles.

A modification of the testing device 6 of FIG. 14 is shown in FIG. 16A in a fragmentary view. Here, the contact needles 49 are in the form of so-called rigid pins which are axially loaded by the respective test specimen 24 without being bent thereby.

Figure 16C:
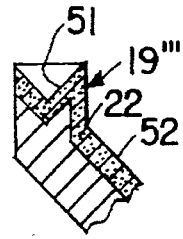

Two of these contact needles 49 are illustrated and the testing device can have a large number of the same. They are slidably supported in through bores of front and rear guide plates 53, 54. Also fast with the horizontal guide plates 53, 54, which are fixedly connected to one another, is an H-plate 10 which is likewise illustrated on a reduced scale in a sectional fragmentary view. The H-plate 10 has micromechanically produced, inclined projections 19''', e.g., cylindrical projections or projections resembling leaf springs, which are integral therewith. Each of these has a cup-like recess 51 (FIG. 16B) at its upper side which receives the rearward end of a contact needle 49 so that the contact needles 49 are resiliently supported in axial direction on these elastic projections 19'''. These projections 19''' form abutments 52 for the contact needles 49 and can again be highly doped entirely or in part, be it as a p region or an n region, as shown by way of example in FIG. 16C. In FIG. 16C, the region 22, which is here n-doped, can also be the region of a non-illustrated transistor integrated in the H-plate. Alternatively, each projection 19''' can have a p region and an n region 21, 22 which are disposed next to one another (FIG. 16B where each of these regions can again be a region of a non-illustrated, integrated transistor) as is the case for the projections 19 of FIG. 2D, for instance. These projections 19''' thus serve to electrically connect the contact needles 49 to the H-plate 10. These contact needles 49 can once more have extremely small diameters, e.g., of the order of 0.1 mm.

The testing circuit system can again be designed in any suitable manner. For example, it can have a wiring layout identical or similar to those known from conventional testing devices with contact needles. As before, in novel fashion, the testing circuit system or parts thereof can expediently be integrated in the H-plate 10 consisting of one or more semiconducting constituents. This H-plate 10 is held on a non-illustrated support together with the guide plates 53 and 54.

Figure 16D:
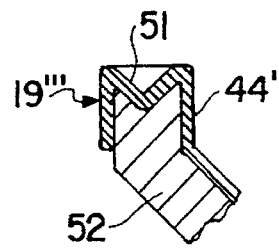

It is also possible to metallically coat the projections 19''' in their entirety or, along strips and to allow the contact needles 49 to rest against this metallic coating 44' as FIG. 16D shows by way of example. The metallic coatings 44' of the projections 19''', rather than a doped region 21, or doped regions 21, 22, as electrically conductive material of the projections 19''', then function to electrically connect the contact pins 49 to the conductive paths produced on the main portion 28 of the H-plate 10 by coating or to the transistors or the like integrated in the H-plate 10.

In many situations, the H-plate 10 can also be designed such that electrically conductive parts thereof only have metallic coatings for establishing electrical connection of the contact needles 49 or, when the sensing points are provided on the H-plate 10 and are metallic, for then establishing electrical connection of these sensing points to the testing circuit system. The testing circuit system is, in this case, not disposed on the H-plate 10 and can, for instance, be in the form of a special apparatus which is electrically connected to the at least one H-plate of the testing device. The manufacture of such an H-plate from a semiconductor which is preferably monocrystalline, particularly a semiconductor of silicon, still has the important advantage that its micromechanically produced structures allow extraordinarily small center-to-center distances of neighboring sensing points or contact needles to be obtained in the simplest possible manner.

We claim:

1. A testing device for checking electrical or electronic test specimens including printed circuit boards, unequipped printed circuit boards, chips and multichip systems, the testing device comprising sensing points (9;49) which, during checking of a test specimen, are positioned opposite test points of the test specimen for the transfer of test signals from a semiconductor plate (10) wherein the sensing points (9;49) of the testing device are sufficiently closely spaced to permit testing at multiple test points, with at least two sensing points (9;49) positioned opposite each test point, and wherein a multiplicity of sensing points (9) are disposed opposite each test point, and wherein the sensing points are provided on micromechanically produced structures located on a surface of the semiconductor plate (10) and wherein each of the sensing points (9) has at least two doped regions (21, 22) which extend to an end face of the sensing point.

2. A testing device according to claim 1, wherein doped, semiconducting regions of the semiconductor plate (10) form part of a testing circuit and are associated with the sensing points (9).

3. A testing device according to claim 2, wherein the testing circuit for carrying out an electrical check of the respective test specimen includes switching elements for electrically connecting sensing points (9) of the testing device to the testing circuit, and, for checking of a test specimen, and test signals generated by the testing circuit and being transferable between said sensing points (9) of the testing device and said test points of the test specimen located opposite the same, the test signals being evaluated in the testing circuit to determine whether or not the test specimen is free of electrical defects.

4. A testing device for an electrical or electronic component, particularly a printed circuit board, a chip or a multichip system, having a plurality of test points for the transfer of test signals between the component and said device, said device comprising a support; and a multiplicity of sensing elements which engage said support at least during testing of the component, each of said elements defining at least one sensing point for the transfer of test signals between the component and said device, and said elements being arranged such that at least two of said sensing points confront each of said test points during testing of the component, wherein a selected one of said sensing points comprises at least two doped, semiconducting regions.

5. The device of claim 4, wherein the sensing element defining said selected sensing point has an end face which confronts one of the test points during testing of the component and said selected sensing point is disposed at said end face.

6. The device of claim 4, herein said selected sensing point comprises an n-doped region and a p-doped region.

7. The device of claim 4, wherein said support is provided with a semiconducting portion which is arranged to be electrically coupled to said selected sensing point, said semiconducting portion constituting part of a testing circuit for checking the component.

8. The device of claim 7, wherein said semiconducting portion is doped.

9. A testing device for an electrical or electronic component, particularly a printed circuit board, a chip or a multichip system, having a plurality of test points for the transfer of test signals between the component and said device, said device comprising a support; and a multiplicity of sensing elements which engage said support at least during testing of the component, each of said elements defining at least one sensing point for the transfer of test signals between the component and said device, and said elements being arranged such that at least two of said sensing points confront each of said test points during testing of the component said testing device further comprising a testing circuit for checking the component, said circuit being arranged to generate said test signals, and said circuit also being arranged to evaluate said test signals to determine whether or not the component has an electrical defect, wherein said testing circuit includes switch means for electrically connecting said sensing points thereto.

10. A testing device for an electrical or electronic component, particularly a printed circuit board, a chip or a multichip system, having a plurality of test points for the transfer of test signals between the component and said device, said device comprising a support; and a multiplicity of sensing elements which engage said support at least during testing of the component, each of said elements defining at least one sensing point for the transfer of test signals between the component and said device, and said elements being arranged such that at least two of said sensing points confront each of said test points during testing of the component, wherein at least one of said elements comprises a micromechanical structure, and wherein said micromechanical structure comprises a projection integral with said support, said projection being provided with at least one sensing point of said one element and, wherein said projection comprises an n-doped region and a p-doped region.

* * * * *